(12) United States Patent
Maeda et al.

(10) Patent No.: US 6,456,951 B1
(45) Date of Patent: Sep. 24, 2002

(54) METHOD AND APPARATUS FOR PROCESSING INSPECTION DATA

(75) Inventors: Shunji Maeda, Yokohama; Yasuhiro Yoshitake, Yokosuka; Kenji Oka; Masataka Shiba, both of Yokohama; Atsushi Shimoda, Hiratsuka, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/553,944

(22) Filed: Apr. 21, 2000

Related U.S. Application Data

(63) Continuation-in-part of application No. 09/225,513, filed on Jan. 6, 1999, now abandoned.

(30) Foreign Application Priority Data

Apr. 22, 1999 (JP) .......................................... 11-115296

(51) Int. Cl.$^7$ ................................................ G06F 11/32
(52) U.S. Cl. ...................................... 702/81; 324/512
(58) Field of Search ..................... 702/81–84, 183–185, 702/33–36, 40, 108, 117–118, 119–121, 170, 172, 182; 324/500, 537, 750, 751, 753; 340/500, 635; 716/5; 706/48

(56) References Cited

U.S. PATENT DOCUMENTS

| | | | | |
|---|---|---|---|---|
| 5,680,207 A | * | 10/1997 | Hagiwara | ................ 356/237.3 |
| 5,744,381 A | * | 4/1998 | Tabata et al. | ............ 356/237.5 |
| 5,991,699 A | * | 11/1999 | Kulkami et al. | ............... 438/10 |
| 5,995,219 A | * | 11/1999 | Tabata | .................... 356/237.5 |
| 6,064,484 A | * | 5/2000 | Kobayashi et al. | ......... 356/390 |

\* cited by examiner

*Primary Examiner*—Marc S. Hoff
*Assistant Examiner*—Edward Raymond
(74) *Attorney, Agent, or Firm*—Antonelli, Terry, Stout & Kraus, LLP

(57) ABSTRACT

The present invention is related to an inspection data processing method for processing inspection data composed of coordinates data and characteristic quantity data about a defect generated on a subject of inspection detected with a visual inspection apparatus. The inspection data processing method comprises the following steps: a preparation step of storing a first fatality judgment data group corresponding to the kinds of areas on the subject of inspection and a second fatality judgment data group corresponding to categories of defects beforehand; a first fatality judgment step of judging a first fatality level of a defect corresponding to the kind of an area where the defect exists; a category giving step of giving category to the defect in the inspection data; and a second fatality judgment step of judging a second fatality of the defect based on second fatality judgment data selected according to the category which are given based on the first fatality level of defects judged in the first fatality judgment step.

27 Claims, 10 Drawing Sheets

FIG. 4

| AREA NO. | xs | ys | xe | ye | AREA CLASS VALUE Ac |
|---|---|---|---|---|---|
| 1 | 0 | 0 | 83 | 126 | 0 |
| 2 | 4 | 7 | 36 | 55 | 10 |
| 3 | 4 | 71 | 36 | 119 | 10 |
| 4 | 48 | 7 | 80 | 55 | 10 |
| 5 | 48 | 71 | 80 | 119 | 10 |
| 6 | 36 | 7 | 48 | 119 | 20 |
| 7 | 4 | 55 | 80 | 71 | 30 |
| 8 | 4 | 7 | 18 | 22 | 40 |
| 9 | 8 | 26 | 18 | 36 | 40 |
| 10 | 8 | 40 | 18 | 50 | 40 |
| 11 | 22 | 12 | 32 | 22 | 40 |
| 12 | 22 | 26 | 32 | 36 | 40 |
| 13 | 22 | 40 | 32 | 50 | 40 |

FIG. 5

JUDGMENT OF R (THRESHOLD VALUE)

| AREA CLASS VALUE Ac | LENGTH<br>RL (μm) | AREA<br>Rs (μm²) | BRIGHTNESS<br>RB |
|---|---|---|---|
| 0 | 2 | 4 | L |
| 10 | 1 | 1 | L |
| 20 | 1.5 | 2.25 | M |
| 30 | 1.5 | 2.25 | M |
| 40 | 0.5 | 0.25 | S |

FIG. 6

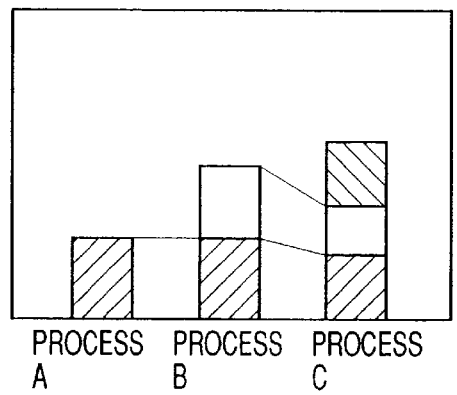

FIG. 7

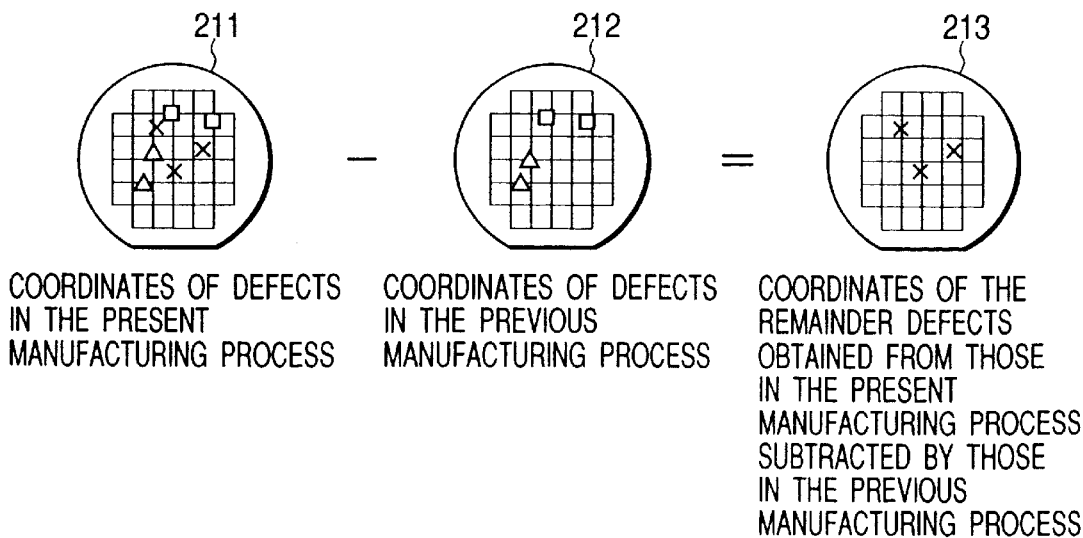

211 COORDINATES OF DEFECTS IN THE PRESENT MANUFACTURING PROCESS

212 COORDINATES OF DEFECTS IN THE PREVIOUS MANUFACTURING PROCESS

213 COORDINATES OF THE REMAINDER DEFECTS OBTAINED FROM THOSE IN THE PRESENT MANUFACTURING PROCESS SUBTRACTED BY THOSE IN THE PREVIOUS MANUFACTURING PROCESS

SUBJECT FOR REVIEW

| DEFECT | x | y | CLUSTER CLASSI-FICATION | REVIEW CLASSI-FICATION |
|---|---|---|---|---|
| P | 600 | 300 | 0 | 50 |
| Q | 200 | 150 | 2 | 75 |
| R | 100 | 75 | 1 | 100 |
| S | 97 | 73 | 1 | 100 |
| T | 102 | 71 | 1 | 100 |

RELATION BETWEEN THE NUMBER OF FATAL DEFECTS AND THE YIELD RATE

MANAGEMENT GRAPH BY THE NUMBER OF FATAL DEFECTS

METHOD AND APPARATUS FOR PROCESSING INSPECTION DATA

CROSS REFERENCE TO RELATED APPLICATION

This is a continuation-in-part of U.S. application Ser. No. 09/225,513, filed Jan. 6, 1999 now abandoned, the subject matter of which is incorporated by reference herein.

BACKGROUND OF THE INVENTION

The present invention relates to an inspection data processing technique which makes it possible to judge a defect as to whether it is fatal or not, the defect which is generated on a semiconductor wafer, a mask, a circuit pattern of liquid crystals, or the like, and in particular it relates to a technique suitable for judging the fatality of a defect detected by a visual inspection apparatus or the like in the manufacturing process of a semiconductor device or for the selection of defects on the subject of review or analysis, and a technique suitable for the investigation of a cause generating a fatal defect and for the planning of the countermeasure for it.

In a manufacturing line of semiconductors, it is essential for the upkeep and the upgrade of the yield rate to feedback the cause of generating a defect to the manufacturing process and to the manufacturing apparatus to remove the defect, and it is essential to plan a measure by finding out the cause of the defect as early as possible. In order to achieve the above object, it is important to find the defect by a visual inspection apparatus and to perform the data analysis in an early stage.

A Japanese Patent Laid-open No. Hei 10-107102 is known as a conventional defect analysis system to be used for the investigation of the cause of a defect in an early stage. The conventional defect analysis system is composed of: a visual inspection apparatus for detecting the defect on a wafer, an analysis station which extracts a group of defects being in a crowded state out of the detected defects, and further extracts one arbitrary defect or two or more arbitrary defects out of the extracted group of defects as a representative defect or defects, and a review station which observes only a representative defect or representative defects extracted in the analysis station for judging the category of the defect and gives identical category to the above-mentioned category also to the other defects which compose the defect group than the representative ones.

The visual inspection apparatus transmits information on the position data or the size data of a defect on a semiconductor wafer, for example, a defect on a circuit pattern such as a short circuit or a breaking of a wire which occurs on a wafer process, or a defect caused by the sticking of a foreign material, to the analysis system which stores these data. Next, the inspected wafer is transferred to the review station, and a stage is moved to the position of the coordinates data of a detected defect to classify the category of the defect with an enlarged image of it.

It is described that, in a visual inspection apparatus, a threshold value which judges whether a defect exists or not from a difference image between a detected image and a reference image is changed with the change in the distribution of brightness in the background in "An Advanced Yield Learning System for 64 M DRAM Production and Beyond" in Technical Proceedings SEMICON/Japan, 1996, pp. 2–19 to 24, which is a prior art.

However, in the prior art mentioned in the above, it is not described to classify defects into fatal/not fatal ones based on the inspection data of the defects detected with the visual inspection apparatus in the review and the analysis work. The fatal defect means, in this case, that the defect has a high probability of causing an electrical trouble in a circuit pattern.

The review work has to be performed by hands, so that it takes much time to do the work; therefore, it may disturb the improvement in the throughput in the inspection process. The judgment of the fatality of a defect has been entrusted to a specific technical expert having not only an ability of observing the defect itself but also the knowledge concerning the function or structure of the circuit pattern in the range in which the defect exists. Further, there has been a problem that the judgment result can be different by persons because the judgment standard are different by persons even among the experts.

SUMMARY OF THE INVENTION

In order to solve the above-mentioned problems, a first object of the present invention is to provide a method and an apparatus for processing an inspection data in which a fatal defect can be accurately selected based on inspection data detected with a visual inspection apparatus.

A second object of the present invention is to provide a method and an apparatus for processing an inspection data which makes it possible to improve the throughput in a review work or an analysis work by an arrangement for making a fatal defect be accurately selected in a review/analysis apparatus with precision to be able to narrow down subjects into one or ones which are really in need of the review work or the analysis work.

A third object of the present invention is to provide a method and an apparatus for processing an inspection data in which the selection of subjects of review/analysis can be performed automatically.

A fourth object of the present invention is to provide a method and an apparatus in which the inspection data can be edited, retrieved, displayed and output to the external utilizing the information of the results of the inspection and the analysis, and to provide a method and an apparatus for effectively performing an analysis for observation of a cross section of a defect.

In order to achieve the above-mentioned objects, in the present invention, the judgment of fatality is performed according to the category of a defect and to the kind of an area in which a defect exists on an inspection subject based on inspection data (coordinates of the defect and characteristic data of the defect) about the defect generated on the inspection subject detected with a visual inspection apparatus.

In other words, the judgment of the fatality of a defect is performed with first fatality judgment data which judges the fatality according to the kind of the area on an inspection subject, and with second fatality judgment data which judges the fatality according to the category of the defect. These data are prepared being stored beforehand.

In the present invention, a manufacturing line is managed based on the number of fatal defects judged with the second fatal judgment data.

In the present invention, a first fatality judgment is performed according to the kind of an area in which a defect exists on an inspection subject based on inspection data (coordinates of the defect and characteristic data about the defect) of a defect generated on an inspection subject and detected with a visual inspection apparatus. A defect to be given a category is selected based on the first fatality judgment.

In the present invention, a first fatality level is calculated according to the kind of an area in which a defect exists on an inspection subject based on inspection data (coordinates of the defect, and characteristic data concerning the defect) concerning the defect generated on the inspection subject which is detected with a visual inspection apparatus. According to the calculated level of the first fatality, a defect to be given a category is selected. For the selected defect, the category is given utilizing a review apparatus, and for the calculated first fatality level concerning the defect, weighting (second fatality judgment data) is performed corresponding to the given category to calculate a second fatality level.

In the present invention, a defect to be analyzed in an analysis apparatus is selected according to the second fatality level.

In the present invention, the number of defects is calculated for categories according to the area of the defect for every different kinds of areas on an inspection subject based on inspection data (coordinates of the defect, and characteristic data concerning the defect) concerning the defect generated on the inspection subject detected with a visual inspection apparatus, and the result is output to an external circuit.

BRIEF DESCRIPTION OF THE DRAWINGS

FIG. 4 shows an illustrative view showing an example of coordinates data in a chip to be used in an embodiment according to the present invention;

FIG. 5 shows an illustrative view showing an example of an area class value, Ac, and fatality judgment data (defect judgment threshold value) corresponding to the area class value to be used in an embodiment according to the present invention;

FIG. 6 shows an illustrative view showing a process of the number of defects for manufacturing processes which generate the defects;

FIG. 7 shows a typical illustrative view showing defects in a present manufacturing process and defects in a previous manufacturing process and the state of the defects in the remainder which is obtained by subtracting the defects in the previous process from the defects in the present process;

DETAILED DESCRIPTION OF THE PREFERRED EMBODIMENTS

Embodiments according to the present invention will be explained in the following.

A system utilizing an inspection data processing apparatus (inspection data analysis apparatus) according to the present invention relates to the improvement in the invention of U.S. application Ser. No. 09/225,513.

Figure 1:
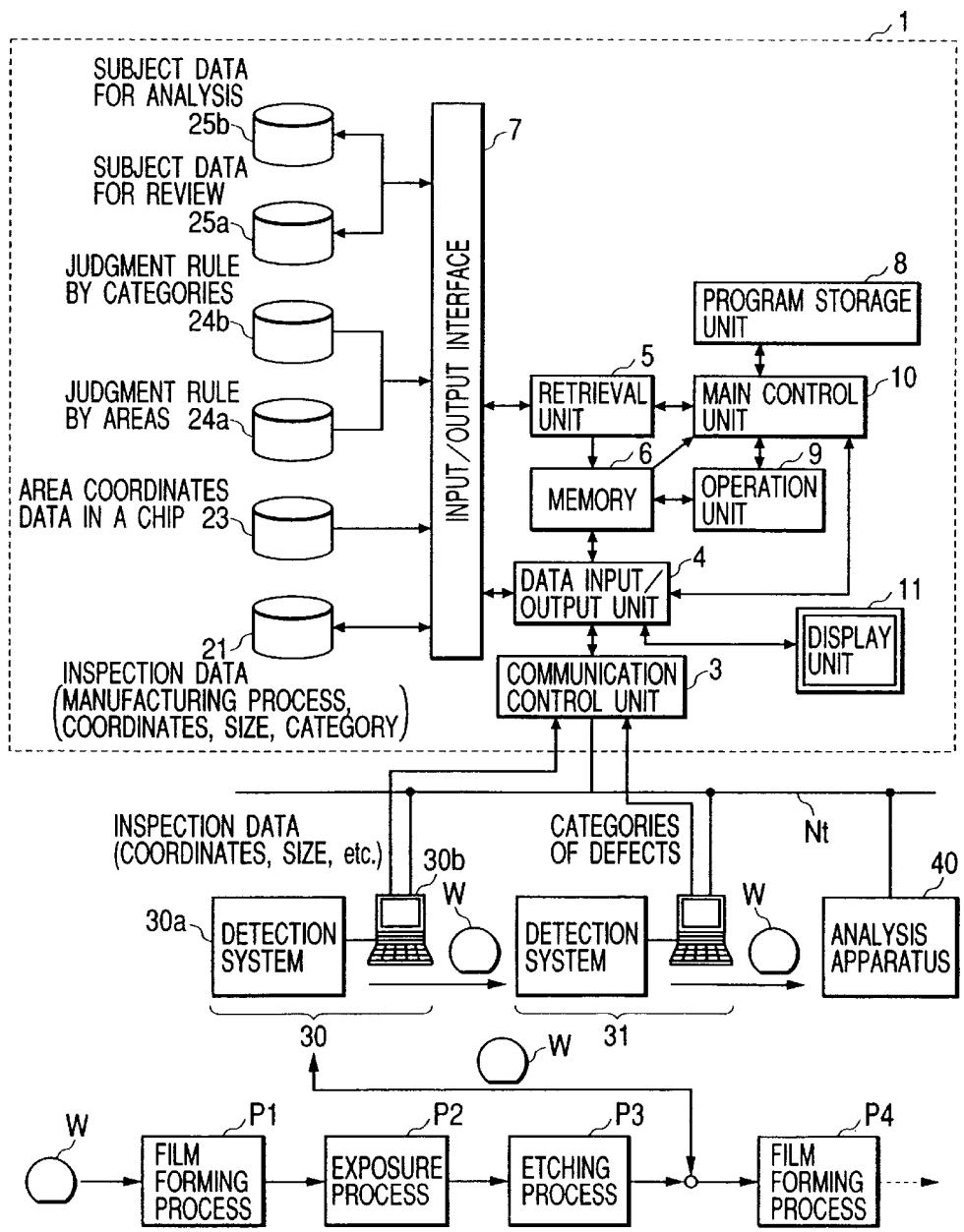
FIG. 1 shows a block diagram showing a first embodiment of a system using an inspection data processing apparatus according to the present invention.

At first, a first embodiment will be explained which utilizes the inspection data processing apparatus (inspection data analysis apparatus) according to the present invention referring to FIG. 1. The inspection data processing apparatus 1 (inspection data analysis apparatus) in the present first embodiment comprises a visual inspection apparatus 30 which inspects various kinds of defects on a circuit pattern formed on a semiconductor wafer, an inspection subject, (a pattern defect, a sticking foreign material(particle), a film thickness defect, a scratch defect, etc.) and outputs the inspection data ID, a review apparatus 31 called ADC (Automatic Defect Classification) which automatically gives categories about a defect, and an analysis apparatus 40 which analyses the quality and the property of a material, a cross-sectional configuration, etc. to find out the cause of the generation of a fatal defect. The visual inspection apparatus 30, the review apparatus 31, and the analysis apparatus 40 are connected to each other through a network Nt. The visual inspection apparatus 30 has an optical visual inspection apparatus or a SEM visual inspection apparatus including a detection system 30$a$ and an image processing unit 30$b$ having a display. The visual inspection apparatus 30 inspects various kinds of defects generated on a semiconductor wafer W at the time, for example, when etching is finished by wafer unit or by lot unit during the progress of process of the semiconductor wafer W, an inspection subject, from a film forming process P1 to an exposure process P2 and further to an etching process P3. In the case of an in-line inspection, after the inspection, the semiconductor wafer W is returned to the course of processes beginning from the film forming process P4. In the actual operation, the visual inspection apparatus 30 will inspect a semiconductor wafer picked up for sampling at an arbitrary manufacturing process in a manufacturing line having many manufacturing processes.

Figure 3:
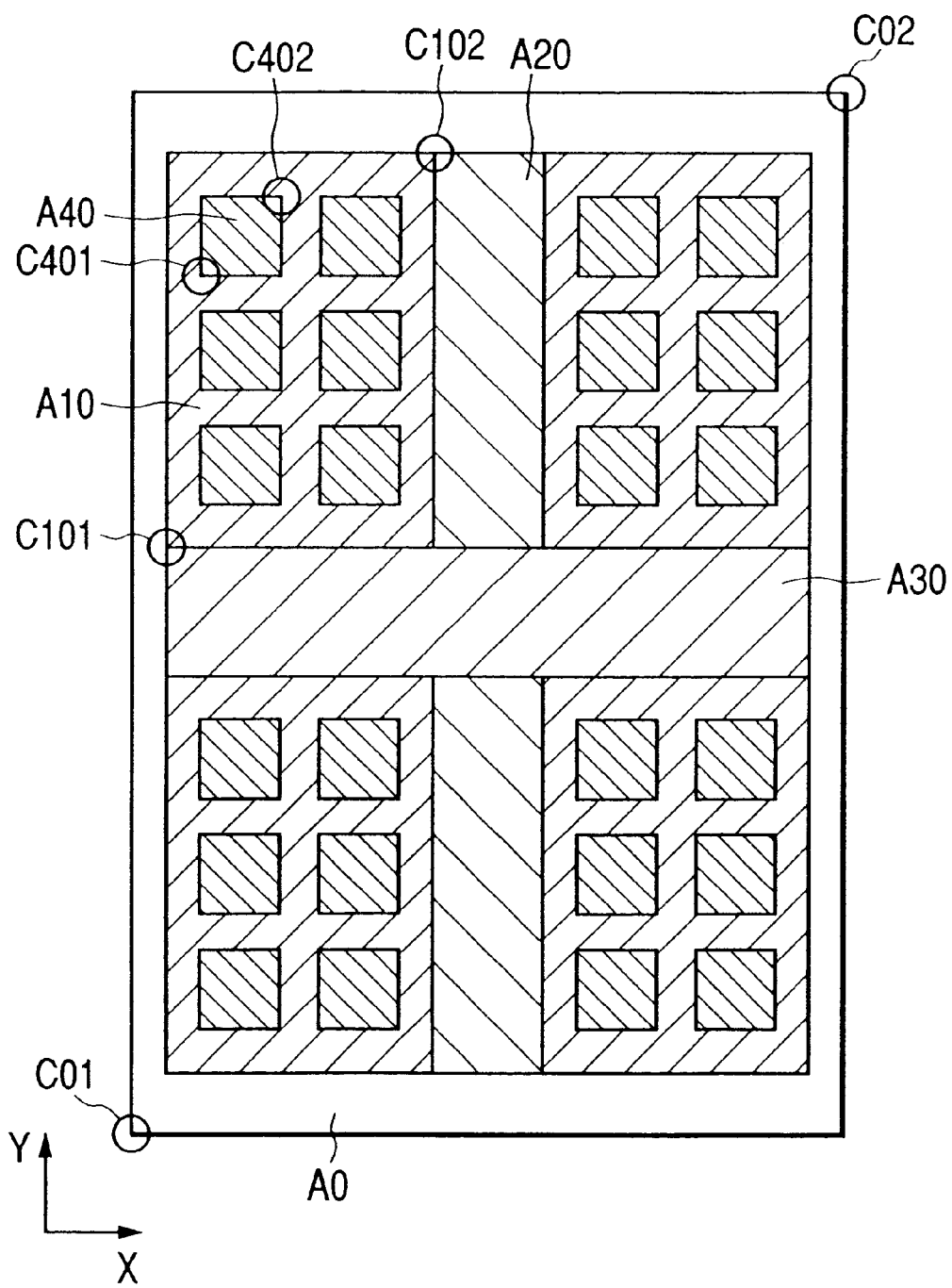
FIG. 3 shows an illustrative view showing an example of an area data in a chip to be used in an embodiment according to the present invention.

The semiconductor wafer W, an inspection subject to be inspected with the visual inspection apparatus 30, is formed with a plurality of semiconductor chips disposed as shown in FIG. 3. In a case where the semiconductor chips are memories, a semiconductor chip C comprises a memory cell area A40, a first peripheral circuit area A10, a second peripheral circuit area A20 including a decoder, etc., a third peripheral circuit area A30 including a decoder, etc., and a fourth peripheral circuit area A0 formed on the outermost thereof. In a case where the semiconductor chip C is a system LSI, the semiconductor chip C has a logic area besides the above-mentioned areas.

As explained in the above, there are various kinds of areas in the semiconductor chip C, such as the memory cell area A40 having the densest circuit patterns, the second, the third, the first and the fourth peripheral circuit areas, A30, A20, A10 and A0, in which the density of circuit patterns gradually decreases in the above order. The present invention was invented paying attention to the fact that the fatality of defects, generated in respective areas and detected with the visual inspection apparatus 30, differs in each area.

Fatality/non-fatality can be made clear by an operation test called a prove test performed for a semiconductor chip in the almost completed stage.

Since a semiconductor wafer W is manufactured through a large number of manufacturing processes (for example, processes of forming a plurality of kinds of films, a resist application process, an exposure process, a development process, an etching process, a resist exfoliation process, a planarizing process in which the surface of an insulating film is planarized with a chemical mechanical polishing method, and so on), a variety of surface configurations of semiconductor wafers to be inspected with the visual inspection apparatus 30 can be considered, and a variety of kinds of defects detected by the visual inspection apparatus 30 may be included (sticking of foreign materials (foreign particles), circuit pattern defects (breaking of wires, short circuits), flaw defects by scratches, etc.). In other words, the surface of a semiconductor wafer can be the surface of an insulating layer between layers or the surface of a circuit pattern (wiring pattern).

It is difficult to clearly judge if a variety of detected defects have fatality or non-fatality in the phase of a semiconductor wafer W inspected by the visual inspection apparatus 30. When a typical conductor pattern width or a conductor pattern space becomes dense, that is, becomes minute, even a minute defect generated in the pattern has a high probability to be a fatal defect, such as the breaking of a wire, or a short circuit; on the contrary to the above, when a typical conductor pattern width or a conductor pattern space becomes large, even a comparatively large defect generated in the pattern has a small probability to be a fatal defect such as the breaking of a wire or a short circuit. Further, the level of fatality is different according to the category of a defect. Therefore, it is made possible to narrow down the subjects of defects to be analyzed in the analysis apparatus 40 to those having a high degree of fatality by calculating the level of fatality according to the area in which a defect exists and the category of a defect. As a result, it is made possible to realize a high throughput in the analysis apparatus 40 which investigates the cause of the generation of a defect.

The visual inspection apparatus 30 outputs, as an inspection ID, the information concerning the inspected wafer W, an inspection subject, (a wafer number, a lot number, manufacturing process number, etc.), the coordinates of various kinds of defects (for example the coordinates of the center of gravity) making a reference mark formed on the wafer as a datum point, and the characteristic quantity data CD of the defect (data concerning the size of a defect: to be concrete, for example, $CD_L$ are shown the projected length on the X axis and the Y axis of a defect, $CD_S$ is shown the area of a defect, CDB is shown the change in brightness (light and shade), etc.). The information concerning a wafer W (including the information concerning the manufacturing process), the coordinates of a defect on the wafer, and the characteristic quantity data IDC (the data about the size of a defect) of a defect output from one unit or a plurality of units of visual inspection apparatus 30 as the inspection data ID are stored in the inspection data storage unit 21 provided in the inspection data processing apparatus 1, for example, through the Internet Nt.

The review apparatus 31 is one called ADC composed of a metallurgical microscope or a scanning electron microscope (SEM), and it judges the category of a defect automatically by colors or by shapes of the designated defect based on the coordinates of the defect to output the judgment result, i.e., the category to which the defect belongs. The review apparatus 31, concerning a defect designated based on the coordinates of the defect, classifies the category of the defect utilizing an enlarged picture of an image observed with the metallurgical microscope or SEM, and the review apparatus 31 may input the result of classification using an input means and output it. The information IDK of the category of the defect classified with the review apparatus 31 (for example, sticking of a foreign material, a circuit pattern defect, a flaw defect by a scratch, and others) is stored in the inspection data storage unit 21, for example, through the Internet Nt. The review apparatus 31 may be disposed in the visual inspection apparatus 30 or in the vicinity of it.

The analysis apparatus 40 comprises a SEM, a FIB (Focused Ion Beam) analysis apparatus, a combination of a SEM and a FIB processor, a mass spectrometer, an X-ray spectroscope, etc. We are able to presume the cause of the generation of a defect from the result of the analysis for the quality of material or the configuration of a cross-section on which the defect is generated.

The inspection data processing apparatus 1 comprises a communication control unit 3 which controls the input/output data to and from the visual inspection apparatus 30, the review apparatus 31, and the analysis apparatus 40, and a data input/output unit 4 which performs the exchange of data between the communication control unit 3 and the data input/output unit 4.

Further, the inspection data processing apparatus 1 comprises a storage unit composed of an inspection data storage unit 21, a storage unit 23 for area coordinates data in a chip, and a fatality judgment data storage unit 24 (having a judgment rule by areas 24a and a judgment rule by categories 24b), a retrieval unit 5 which retrieves respective groups of data stored in respective storage units, and a memory 6 which stores the retrieved data obtained by the retrieval unit 5.

Into the area coordinates data storage unit 23, for example, from a CAD system (not shown in a drawing) of semiconductor elements, area coordinates data in a chip, for example, as shown in FIG. 4 are stored beforehand by the function of the data input/output unit 4 through the network Nt. In the case where the area coordinates data in a chip have been already input to the visual inspection apparatus 1A from, for example, the CAD system and stored there, the data should be naturally input from the visual inspection apparatus 30 for storage. As shown in FIG. 4, the area coordinates data in a chip about an area No. 1 are shown, for example, by starting point coordinates (xs, ys) and end point coordinates (xe, ye) of the fourth peripheral circuit area A0 shown by an area class value 0 formed by the coarsest circuit patterns. About areas No. 2 to No. 5, area coordinates data are shown by starting point coordinates and end point coordinates of, for example, the first peripheral circuit area A10 shown by an area class value 10 formed by circuit patterns having the fineness next to the above. About areas No. 6 and No. 7, area coordinates data are shown by starting point coordinates and end point coordinates of, for example, the second and the third peripheral circuit areas, A20 and A30 shown by the area class values 20 and 30 formed by circuit patterns having the fineness next to the above. On and after an area No. 8, area coordinates data are shown by starting point coordinates and end point coordinates of, for example, the memory cell area A40 shown by an area class value 40 formed by the finest circuit patterns. In the above explanations, respective areas are set being divided according to the density of the circuit patterns; however, it is also possible to set them according to the thickness of insulating films, or to the density of circuit patterns formed on the films. The reason is that when a defect is generated due to the sticking of a foreign material or the flaw by a scratch, there is a high probability that operation failures such as breaking of wires and short circuit occur, resulting in fatality, depending on the thickness of an insulating film. The fatality is also varied by the change in the influence of a defect which is changed according to the density of circuit patterns formed on the surface on which the defect is generated. In other words, when the circuit pattern formed on the defect is a minute one, even a minute defect has a high probability of causing a malfunction, and the defect may become to have fatality.

Further, as shown in FIG. 5, the fatality judgment rules by areas corresponding to the accuracy (density) of circuit patterns formed in respective areas are input to a storage unit 24a for fatality judgment data by areas and stored in it utilizing an input means (not shown in a drawing) connected to the input/output unit 4. The fatality judgment rules by areas is set in correspondence to an area class value Ac. A semiconductor wafer is completed by forming active elements on a semiconductor substrate and forming multi-layered wiring layers on the active elements. Therefore, fatality judgment threshold values R (criterion) by areas about defects generated on circuit patterns (wiring patterns) in respective layers are delicately different from each other. The criterion R by areas concerning a defect generated on an insulation film between layers is different from that concerning a defect generated on a circuit pattern, and these criterions are also influenced by circuit patterns formed on the insulation film. However, as the criterion R by areas concerning a defect generated on a circuit pattern, as roughly shown in FIG. 5, for the area class values Ac=0 to 40 in respective areas A0 to A40, for example, the lengths of defects $R_L$ showing the characteristic quantities of defects are set to be: 2 μm, 1 μm, 1.5 μm, 1.5 μm, 0.5 μm, the areas of defects $R_S$ are set to be: 4 μm$^2$, 1 μm$^2$, 2.25 μm$^2$, 2.25 μm$^2$, 0.25 μm$^2$, and the brightness (gradation) of defects $R_B$ (Difference in brightness to a normal part) is set to large (L), medium (M), and small (S). The criterion R by areas should be set according to the configuration of the surface of a semiconductor wafer. The criterion R by areas should be set according to the density of circuit patterns to be formed on it.

As fatality judgment rule by categories, a coefficient, function for weighting the criterion R by areas according to the category of a defect, or a lookup table K are set and stored in a storage unit 24b for fatality judgment data by categories. In other words, in the case where a defect is caused by the sticking of a foreign material, the area or the brightness of a defect is detected conspicuously in comparison with the length of the defect with the visual inspection apparatus 30, so that the area or the brightness of the defect should be largely weighted in comparison with the length of the defect. In the case where a defect is caused by a circuit pattern defect, the length or the area of the defect is conspicuously detected in comparison with the brightness of the defect with the visual inspection apparatus 30, so that the length or the area of the defect is largely weighted in comparison with the brightness of the defect. In the case where the defect is caused by a flaw, a different form of weighting method is adopted.

As explained in the above, basically the fatality judgment data by areas R should be set for every area in a chip according to the surface configuration of a semiconductor wafer W. For the fatality judgment data by categories K, a coefficient, a function or a lookup table, performs different kind of weighting according to the category of a defect, a lookup table, etc. are set. Whether these fatality judgment data by areas and those by categories are properly set or not can be confirmed by collecting statistics in correspondence to the operation test results obtained in prove tests for almost completed semiconductor chips.

The retrieval unit 5 is connected to the memory 6, and the memory 6 is connected to the data input/output unit 4. Further, the inspection data processing apparatus 1 comprises an input/output interface 7 which adjusts the timing of data exchange between the inspection data storage unit 21, the storage unit 23 for the area coordinates data in a chip and the storage unit 24 for the fatality judgment data. The retrieval unit 5, the data input/output unit 4, the inspection data storage unit 21, the storage unit 23 for the area coordinates data in a chip, and the storage unit 24 for storing the fatality judgment data are connected to the input/output interface 7.

Further, the inspection data processing apparatus 1 comprises a program storage unit 8 in which a program, i.e., a piece of software for performing a necessary process, is stored, and an operation unit (to be a first and a second operation units) 9 which performs operation based on the program stored in the program storage unit 8. The operation unit 9 is connected to the memory 6.

The inspection data processing apparatus 1 has a main control unit (to be a first and a second control units, etc.) 10 which takes charge of all the control in the inspection data processing apparatus 1. The input/output unit 4, the retrieval unit 5, the memory 6, the operation unit 9 and the program storage unit 8 are connected to the main control unit 10.

Further, a display unit 11 is connected to the data input/output unit 4. The display unit 11 displays the data from the inspection data storage unit 21, the storage unit 23 for the area coordinates data in a chip, the storage unit 24 for the fatality judgment data, and maps of a first and a second fatal defects based on the first and second fatality judgment results.

The inspection data storage unit 21, the storage unit 23 for the area coordinates data in a chip, and the storage unit 24 for the fatality judgment data can be a unit of a storage medium. Further, the inspection data processing apparatus 1 may be connected to another system through the network Nt to transmit/receive the data which exist in the inspection data storage unit 21, in the storage unit 23 for the area coordinates data in a chip, and in the storage unit 24 for the fatality judgment data. The inspection data processing apparatus shown in the first embodiment may be incorporated into the visual inspection apparatus 30 without utilizing the network Nt.

The operation unit 9 and the main control unit 10 may be one unit of CPU. Further, the memory 6, the data input/output unit 4, and the communication control unit 3 may be connected with busses and form one unit of semiconductor element while CPU may be used for the operation unit 9, the main control unit 10, and retrieval unit 5.

Figure 2:
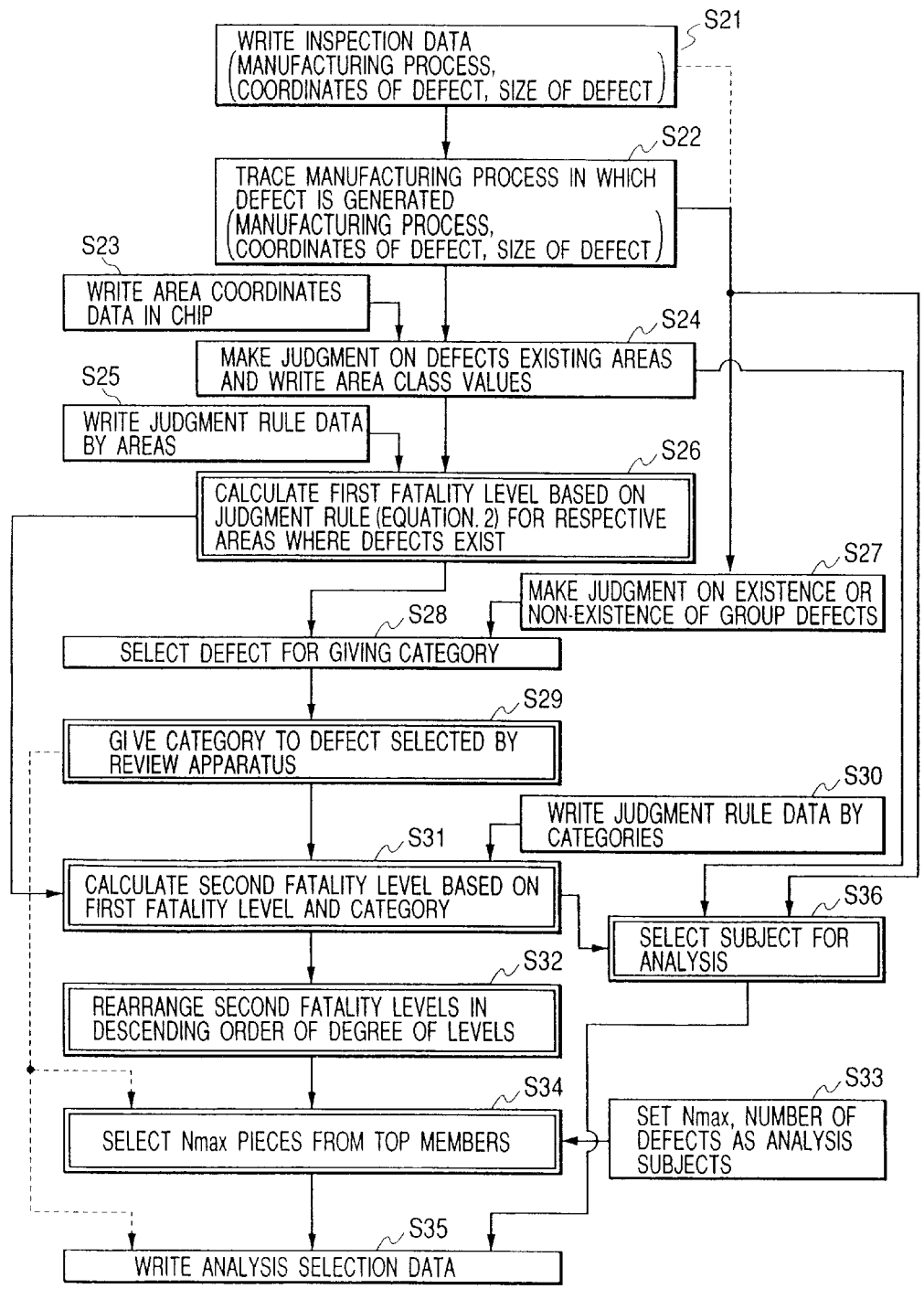
FIG. 2 shows a flowchart showing an example of a process flow of inspection data in the first embodiment according to the present invention.

Next, the data processing method shown in the first embodiment will be explained referring to FIG. 2.

The retrieval unit 5, in step S21, inputs information concerning the wafer inspected with the visual inspection apparatus 30 using the input means (a keyboard, a recording medium, network, etc.) which is connected to the data input/output unit 4 and retrieves inspection data such as manufacturing process, coordinates of a defect, the size of a defect concerning the wafer W stored in the inspection data storage unit 21, and writes them onto the memory 6.

A semiconductor wafer is manufactured with the repetition of manufacturing processes such as forming of films, an exposure process, an etching process, etc., so that the inspection with the visual inspection apparatus 30 is performed in a plurality of manufacturing processes. The number of detected defects by manufacturing processes in which defects will be generated is shown in FIG. 6, and it shows that a defect detected in a previous processes A and B is also detected in a process C. Therefore, with the progress of processes, the number of defects which had been already subjected to the inspection of the review/analysis apparatus increase among defects which are to be the subjects of the inspection of the review/analysis apparatus, which deteriorates the time-wise efficiency of the review and analysis inspection operation.

It is preferable to add the following processes to the process performed with the operation unit 9. In step S22, the operation unit 9 performs alignment between coordinates data 211 of a defect on a wafer detected in the present manufacturing process and coordinates data 212 of a defect on the wafer detected in the previous manufacturing process. These two defects, as shown in FIG. 7, are retrieved in step S21 and written onto the memory 6. When the coordinates data 211 and 212 coincide with each other or both positions are in a closer distance than an allowable value set beforehand, these two defects are eliminated, and the coordinates data 213 of a defect which is newly found in the present manufacturing process are stored in the inspection data storage unit 21 (or in a storage units 25a and 25b for storing the subject data for the review/analysis). In other words, the operation unit 9 is made possible to trace a manufacturing process where a defect was generated. As a result, it is made possible to prevent a loss time of performing a double check by the review/analysis process. In order to investigate the state of the defect in the present manufacturing process, and that of the defect which is generated in the previous manufacturing process, it may be effective to extract these defects and perform a fatality judgment or review process. The process to be performed in step S22 may be executed inside the visual inspection apparatus 30.

Further, the retrieval unit 5, in step S23, referring to the reference mark formed on a wafer, retrieves area coordinates data in a chip stored in the storage unit 23 for the area coordinates data in a chip about respective chips C disposed on the wafer based on the information concerning the wafer written in the above, and writes the retrieved data onto the memory 6.

The area coordinates data in a chip can be expressed as shown in FIG. 3 showing the layout in a chip; for example, a chip is divided into a plurality of areas, A0, A10, A20, A30, A40, according to the kinds of widths of circuit patterns (as area class value Ac) used, and the respective areas are expressed with rectangles, and each of them is expressed with coordinates at the left lower corner (xs, ys) and those at the right upper corner (xe, ye). For example, the area A0 can be expressed with coordinates C01 and C02, similarly the area A10 can be expressed with coordinates C101 and C102, and the area A40 can be expressed with the coordinates C401 and C402.

Further, the area coordinates data in a chip comprise the coordinates at the left lower corner (xs, ys), those at the right upper corner (xe, ye) and the area class value Ac expressing the category of an area as shown in the coordinates data table shown in FIG. 4. The area coordinates data in a chip are written with hand-input or with file read from CAD data. Since respective chips C are disposed at a substantially equal pitch on a semiconductor wafer W, the position of the origin (for example, C01) of the area coordinates data in a chip can be easily calculated in the operation unit 9 from the reference position for the semiconductor wafer based on the CAD data.

Next, the retrieval unit 5, in step S24, reads out the coordinates, characteristic quantity data, etc. concerning the defect No. N generated on a wafer and detected with the visual inspection apparatus 30, based on the information concerning the semiconductor wafer W input to the retrieval unit 5 in step S24 as described in the above, from the inspection data storage unit 21, and stores them temporarily in the memory 6. The operation unit 9 converts the coordinates of the No. N defect to the coordinates (xN, yN) taking the origin of No. M chip as a new origin, and compares the converted coordinates (xN, yN) with the coordinates in respective areas read in the memory 6, and finds the area where the No. N defect exists to write the area class value AcN onto the memory 6 in correspondence to No. N defect. The area in which the No. N defect exists is judged whether the expression (1) is satisfied or not, searching respective areas in the order of the area number, and the area class value Ac is superscribed in the order of the area No.

$$xs < xN < xe,\ ys < yN < ye \quad (1)$$

Therefore, among the areas in which the above expression (1) is satisfied, for example, the area class value Ac in an area which shows the largest area No. is calculated, and the value Ac is written onto the memory 6 and onto the inspection data storage unit 21 in correspondence to the No. N defect.

In the above explanation, the area class value Ac is given to every area based on the area coordinates in a chip; however as described in the U.S. application Ser. No. 09/225,513, the left lower coordinates (xs, ys) and the right upper coordinates (xe, ye) are converted to the pixel coordinates IP (I, J) by equation (2) shown below, and the area class value Ac may be given to pixel coordinates showing the converted respective areas.

$$IXs = Int(xs/P),\ IXe = Int(xe/P)$$

$$IYs = Int(xe/P),\ IYe = Int(xe/P) \quad (2)$$

where P shows a pixel pitch set beforehand and Int shows a function in which the figures below the decimal point are omitted.

In this case, it is necessary to convert the coordinates (x, y) of a defect detected with the visual inspection apparatus into the pixel coordinates (KX, KY) by equation (3)

$$KX = Int(x/P),\ KY = Int(y/P) \quad (3)$$

As mentioned in the above, when area image data in a chip expressed by the pixel coordinates is used, there is an effect that the area in a chip where a defect exists can be found in a moment.

Next in step S25, the retrieval unit 5 retrieves the fatality judgment data by areas (fatality judgment rule data) R corresponding to respective areas in a chip, A0 to A40, on the wafer W in the manufacturing process read in step S23 out of the storage unit 24a for the fatality judgment data by areas and writes them onto the memory 6. The fatality judgment data by areas written on the memory 6, as shown in FIG. 5, becomes a judgment threshold value (criterion value) R corresponding to the area class value Ac in the manufacturing process. The judgment threshold value R is set for every area in the manufacturing process. The judgment threshold value R is composed of the characteristics quantity of a defect, the length of the defect $R_L$, the areas of the defect $R_S$, the brightness of the defect $R_B$ (light and shade), etc. set for every area in the manufacturing process. For example, the judgment threshold value R becomes a value corresponding to the values shown below: a typical pattern width or pattern space in respective areas, a pattern width or pattern space to be formed over the above patterns in the next manufacturing process, and process information such as the design value of film thickness, a partial variation of thickness due to a grain. Since the design value of the typical pattern width or pattern space differs by areas, the judgment threshold value R, that is, the fatality judgment data, has to be varied by areas. Because of the fact mentioned in the above, the fatality judgment data R for a defect has to be changed referring to the area class value Ac of the area where the defect exists. The areas in a chip are further fractionated, for example, an area is fractionated into respective pattern portions, respective space portions, area class values Ac are allotted to respective portions, and the judgment threshold values R may be set corresponding to the allotted area class values Ac.

Next, in step 26, the operation unit 9 performs a calculation of first fatality level for all defects generated on the wafer and detected with the visual inspection apparatus 31, based on the fatality judgment rule corresponding to the area where exists a defect which has been stored in the memory 6 after being retrieved in step S25, and the calculated first fatality levels are stored in the inspection data storage unit 21 in correspondence to defects. The purpose of the above operation is to decrease the number of defects to be given categories by the review apparatus 31 as many as possible for preventing the vain review work. If the review apparatus 31 has a function to recognize the size, etc. of a defect, it becomes possible to give the categories to defects automatically performing a selection operation to a certain degree for the defects generated on the wafer. In this case, step 28 can be eliminated.

In step S26, it is naturally possible that the operation unit 9 classifies the detected defects into a group of fatal defects and a group of non-fatal defects by the judgment whether the calculated first fatal level exceeds the predetermined first criterion value or not, and stores the classified defects in the inspection data storage unit 21.

Next, about the steps S24, S26, as described in the U.S. application Ser. No. 09/225,513, the concrete explanation will be given referring to FIG. 8. In step S241, the retrieval unit 5 starts retrieval from a defect number, N=1, which is generated on the wafer and detected with the visual inspection apparatus 1A based on the input information concerning the semiconductor wafer W. The operation unit 9, in step S242, judges the chip and the area in the chip where a defect exists from the coordinates of the defect No. 1, gives a chip number to the chip, and the area class value Ac is written onto the memory 6. Next in step S261, the operation unit 9 reads out the threshold value R1 (for example, the length of a defect $R^L1$, the area of the defect $R_S1$, the brightness of the defect $R_B1$, etc. corresponding to the area class value Ac1), that is, the fatality judgment data corresponding to the area class value Ac1 in the area where the defect No. 1 exists which has been written on the memory 6. Further the operation unit 9 reads out the characteristic quantity data CD1 (for example, the length of a defect $CD_L1$, the area of a defect $CD_S1$, the brightness of a defect $CD_B1$, etc.) concerning the defect No. 1 stored in the memory 6. The operation unit 9 performs a first fatality judgment substituting the threshold value R1 being a fatality judgment data corresponding to the read out area class value Ac1 and the characteristic quantity data CD1 of the defect No. 1 into equation 4 shown below. In the judgment threshold value R1 for judging the fatality of a defect, there are the length of a defect $R_L1$, the area of a defect $R_S1$, the absolute value of the difference between the brightness in the normal space and that in the defect $R_B1$, etc., which have a high probability of causing a fatal defect such as the breaking of wire or the short circuit which may cause a malfunction in circuit operation. In equation (4), it is possible to select one to which the priority is to be given according to the category of the defect. As the first fatality judgment, there are the first judgment, "fatality exists or fatality does not exist", and the calculation of gradation value data FAL 1 showing the first fatality level (degree), for example, a ratio, etc.

| The first fatality | $CD_L1/R1$ | (where, $R1 = R_L1$) |
|---|---|---|
| | $CD_S1/R1$ | (where, $R1 = R_S1$) |
| | $CD_B1/R1$ | (where, $R1 = R_B1$) – (4) |

In the case where the defect No. 1 is judged to have the first fatality by the equation (4), the operation unit 9, in step S262, writes the first fatality classification data and the gradation value data FAL1 showing the first fatality level onto the memory 6 in correspondence to the defect No. 1. In the case where the defect No. 1 is judged to have no first fatality, the operation unit 9, in step S263, writes the first non-fatal classification data and the gradation value data FAL1 showing the first non-fatal level onto the memory 6. A fatality classification data can be obtained referring to the gradation value data FAL1 showing the first fatality level.

The gradation value data FAL1 showing the first fatality level has taken a value of a simple ratio in the equation (4); however as described later, in order to enable the FAL1 to express the influence exerting upon a circuit pattern more precisely from the result of a prove inspection etc., it is also possible to calculate the FAL1 utilizing a function or a lookup table.

The fatality judgment concerning the defect No. 1 has been completed by the explanation described in the above.

Next in step S264, the operation unit 9 proceeds to the defect No. (N=N+1) and repeats the steps, S242, S261, S262, S263, as explained in the above until it is judged in step S265 that the processes concerning all the defects generated on the semiconductor wafer W are finished. Thereby, about all the defects generated on the semiconductor wafer W, based on the characteristic quantity CD and the judgment threshold value R set corresponding to the area in which the characteristic quantity CD exists, the calculation of the first fatality judgment and, in the case where the first fatality exists, the calculation of the gradation value data FAL showing the fatality level of the defect are performed by the equation (4) and stored them in the memory 6 corresponding to the defect No.'s.

When the operation unit 9, in step S265, is judged that the first fatality judgment concerning all the defects generated on the waver W is completed, the main control unit 10, in step S266, writes the first fatality judgment result (including the gradation value data FAL showing the first fatality level) which is written onto the memory 6 in steps, S262 and S263, and the area class values Ac written onto the memory 6 in step 242 as occasion demands, for example, onto the inspection data storage unit 21 in correspondence to the No.'s of defects.

By the processes described in the above, for example, in the inspection data storage unit 21, concerning a certain semiconductor wafer W the inspection data ID and the fatality judgment result output from the visual inspection apparatus 30 are stored in correspondence to respective defects. The main control unit 10 and/or the operation unit 9 calculates the number of the first fatal defects generated on the inspection wafer by wafer unit or by lot unit as the management value of a manufacturing line shown in FIG. 10, and in order to enable the review station 31 to review defects giving priority to a defect having a higher first fatality level, the data of defects can be stored in a review subject data storage unit 25a as the subject data for review. As a management value of the number of fatal defects having mutual relation with the yield rate shown in FIG. 10, a second fatality is superior to the present one from the point of precision.

In the case where defects generated on a wafer are those caused by flaws or by sticking of foreign materials, in some case defects are generated in thick profusion, which might be rather natural considering the causes. In this case, they are naturally detected with the visual inspection apparatus 30 as a cluster defects composed of a large number of defects, and stored in the inspection data storage unit 21. In the case of the cluster defects, the defects are considered to be generated by the same cause, so that there is no need to analyze all the defects in the cluster generated on the wafer and the analysis of several pieces of the cluster defects will suffice.

Figure 8:
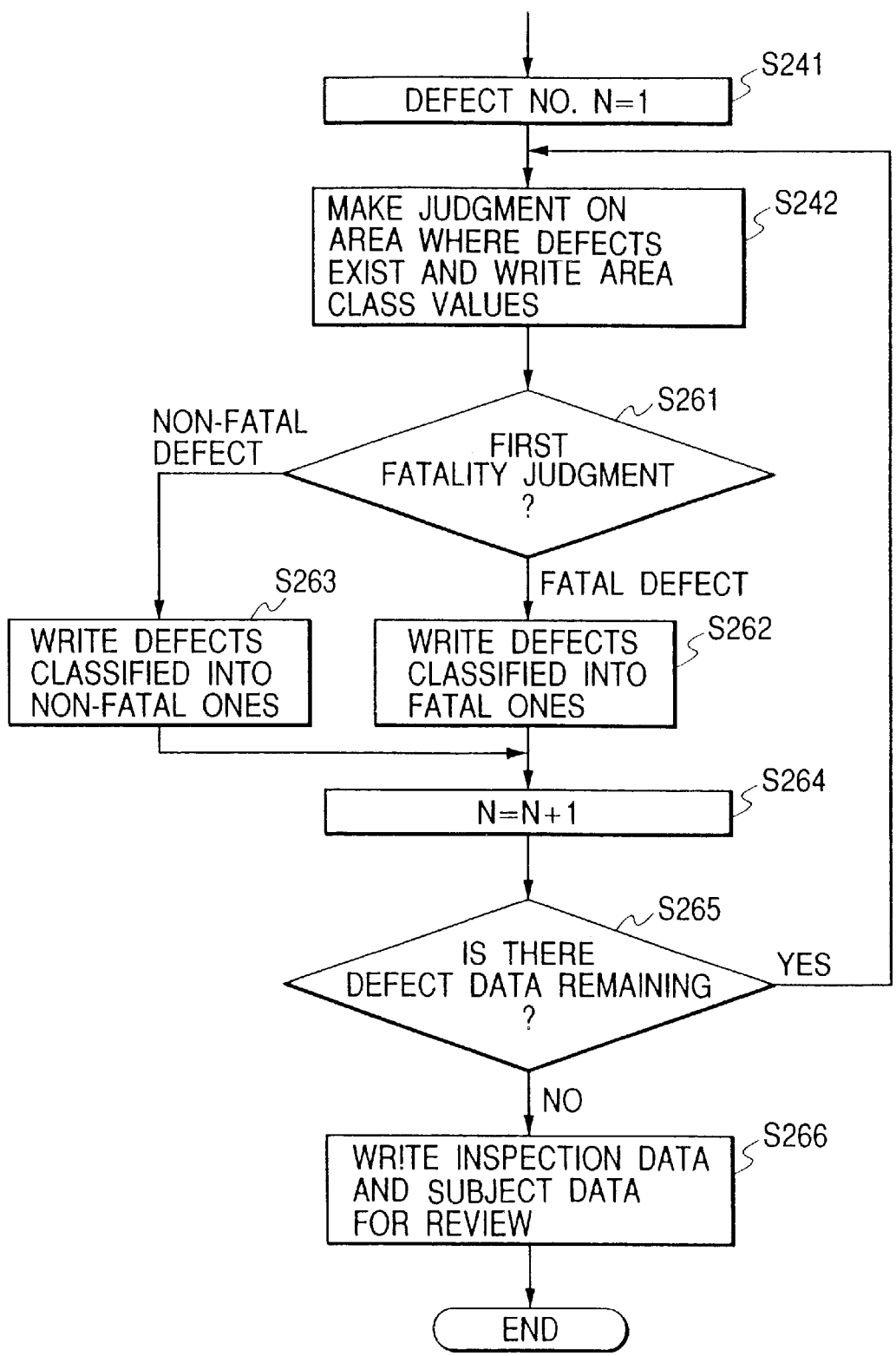
FIG. 8 shows a detailed flow of data in a first fatality level calculation shown in FIG. 2.
Figure 9A:
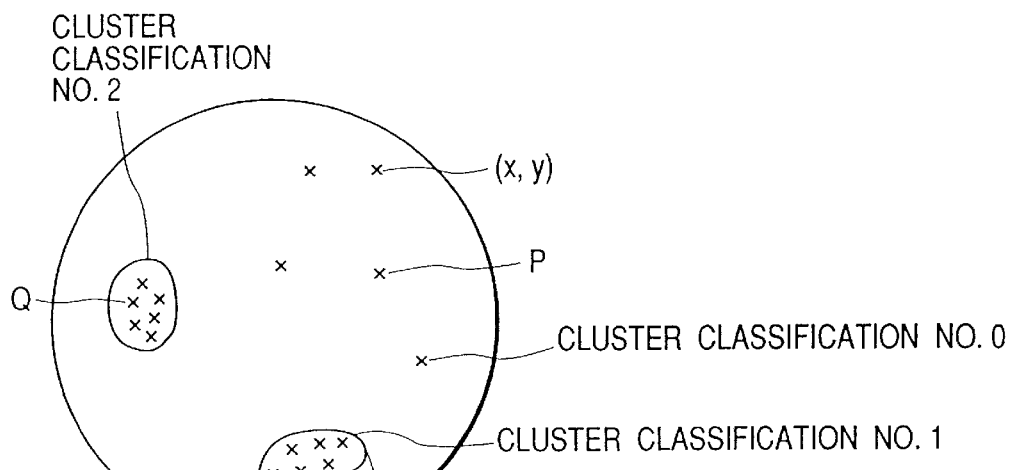
FIG. 9 shows an illustrative view showing an example of the cluster defects and the review/analysis subject defects in a cluster.
Figure 9B:
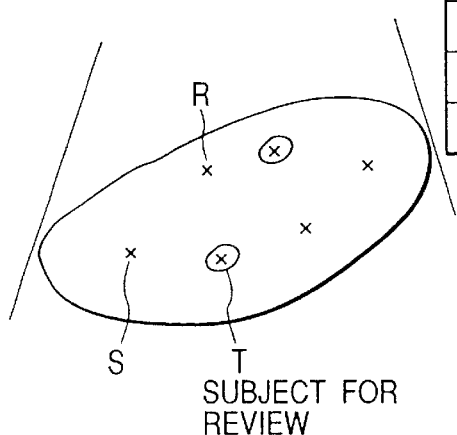

The operation unit 9, in step S27, performs the judgment as to whether a defect belongs to cluster defects or not (whether it belongs to cluster defects or to random defects), as shown in FIG. 8, based on the coordinates data (x, y) of a newly found defect on a wafer which is written on the memory 6 by retrieval from the inspection data storage unit 21. In the case where the defect belongs to a group of cluster defects, a cluster number is given to each defect and stored in the inspection data storage unit 21. As described in the above, in step S27, for a new defect detected on the wafer, the judgment as to whether the defect belongs to a group of cluster defects or not is performed, so that the subject defects for review to be given categories can be further narrowed down as mentioned later. The judgment as to whether a defect belongs to cluster defects or not is judged by a rule that the defects having coordinates being close to each other belong to the same group of cluster defects, and the same cluster number is given to these defects. The defects which belong to the same cluster defects naturally have the same category, so that, as shown in FIG. 9, the same category is given to these defects as the category (review classification) given after the review. In the above-mentioned judgment as to whether a defect belongs to a group of cluster defects or not, the defects being close to each other are made to be in the same group; however, if physical characteristics of defects such as sizes, brightness, colors, or shapes are fetched into the inspection data storage unit 21 from the visual inspection apparatus 30, the operation unit 9 will be able to classify these defects based on these physical characteristics (based on one of these or on a combination of these). In this case, it is a premise that the defects belonging to the same group should be treated to be in the same category.

As explained in the above, owing to the step S27, not only the cluster defects but also the random defects having the same physical characteristic are formed into a group, so that it is made possible to obtain the analysis result for all the defects in a group by performing review of one to several pieces of defects in the group.

In step S27 about group defects such as cluster defects, the retrieval unit 5 selects a predetermined number of defects from the inspection data storage unit 21 and writes them onto the memory 6.

Next, the operation unit 9 selects the defects to which categories are to be given corresponding to the first fatality level calculated in step S26 from the defects newly generated on a wafer and written onto the memory 6, and obtains the coordinates of them and stores them in the memory 6 or in the review subject data storage unit 25a through the input/output interface 7. In this selection, not only fatal defects but also non-fatal defects having high level fatality close to the level of fatal defects are selected. In this case, defects belonging to a group of defects are further narrowed down as the defects to which a category is to be given. Group defects such as cluster defects will be generated over the areas of different categories, so that these defects are narrowed down after the calculation of the first fatality level.

Next in step S29, a subject wafer is input to the review apparatus 31 and the coordinates of the selected defect are transmitted from the review subject data storage unit 25a to the review apparatus 31 through the network Nt. Thereby, in the review apparatus 31, a category is given for the selected defect, for example, automatically, and the coordinates of the defect are transmitted to the inspection-data-storage unit 21 as inspection data through the network Nt. The category is given to the defects having the coordinates corresponding to the transmitted coordinates, and the defects are stored in the inspection data storage unit 21. Thereby, the retrieval unit 5 reads out the category from the inspection data storage unit 21 and to write it onto the memory 6. The review image itself which is observed or detected in the review apparatus 31 can be stored in the inspection data storage unit 21 in correspondence to the defect to which a category is given.

With the above, about the defects generated on a wafer and detected with the visual inspection apparatus 30, the preparation for the judgment for a second fatality by categories and by areas which is most deeply concerned to the present invention is finished.

Next, the retrieval unit 5, in step S30, retrieves the fatality judgment data by categories (weighting function, etc.) K (CAn) (For example, it is composed of $K_L$(CAn), $K_S$(CAn), $K_B$(CAn), etc.) corresponding to the categories (CAn) of defects out of the storage unit 24b for fatality judgment data by categories, and writes the fatality judgment data by categories K onto the memory 6. In the next step S31 if the fatality-judgment-data-by-categories K (CAn) suffices to be prepared in the memory 6. Next, the operation unit 9, in step S31, multiplies the first fatality level FAL ($CD_LN/R_LN$, $CD_SN/R_SN$, $CD_BN/R_BN$) of various kinds of characteristic quantities (length of the defect, area of the defect, brightness of the defect, etc.) calculated corresponding to the areas where defects exist by the weighting function ($K_L$(CA1)–$K_L$(CAn), $K_S$(CA1)–$K_S$(CAn), $K_B$(CA1)–$K_B$(CAn)) which is set by categories (CA1–CAn) given to the defects which are retrieved in step S30 and stored in the memory 6 or by a lookup table, and for example, sum them up based on the equation (5), and the second fatality levels FAH (CAn) as gradation value data are calculated. The calculated second fatality levels FAH (CAn) are stored in the inspection data storage unit 21 in correspondence to the defects. The CAn shows a certain category of a defect. The gradation value data shows the second fatality level.

It is of course possible that, in step S31, the operation unit 9, depending on the fact that the calculated second fatality level FAH (CAn) exceeds the predetermined second criterion value or not, classifies the detected defects into fatal defects and non-fatal defects and stores them in the inspection data storage unit 21. Even in the case where the detected defects are group defects such as cluster defects, the defects are classified into fatal defects and non-fatal defects corresponding to respective areas in a chip, so that categories are given to a large number of defects composing group defects as fatal defects or non-fatal defects by areas. With the above, it is made possible to find out the number of really fatal defects generated on a wafer.

$$FAH(CAn)=(CD_L N/R_L N) \cdot K_L(CAn)+(CD_S N/R_S N) \cdot K_S(CAn)+(CD_B N/R_B N) \cdot K_B(CAn)+ \quad (5)$$

In order to express the influence exerted on a circuit pattern more precisely by a prove test as described later, in particular the calculation of the second fatality level can be performed utilizing a function or a lookup table by categories.

Therefore, in order that the main control unit 10 and/or operation unit 9 is able to calculates by wafer unit or by lot unit the number of the second fatal defects generated on the inspection wafer as a management value for a manufacturing line as shown in FIG. 10, or the above-mentioned units are arranged so that the analysis is performed in the analysis apparatus 40 in the order of the levels of the second fatality giving priority to the one having a higher level of the second fatality, the calculated data in the above can be stored in the analysis subject data storage unit 25b as the analysis subject data.

Further, the operation unit 9, in step S32, rearranges the second fatality level FAH (CAn), obtained by weighting by categories in step S31, simply in the order of sizes, in the order of priority given to areas (area class Ac) or by categories.

On the other hand, in step S33, for a wafer to be analyzed, the number of defects Nmax to be the subjects of analysis, areas or categories having priority, the maximum number of defects for analysis per chip Icmax are input from, for example, the display unit 11 (assuming that an input function portion is provided), and stored and set in the memory 6 through the data input/output unit 4.

Next, in step S34, the operation unit 9 selects a defect existing at No. Nmax from the defect at the top in the order arranged after the process in step S32 (a defect at No. Nmax from the defect having the highest fatality generated on a wafer W) and in step S35, writes the selected defect and its coordinates onto the analysis-subject data storage unit 25b. It is also possible for the operation unit 9, in step S34, to select a defect having the second fatality generated in an area (area class value Ac) having the priority to be analyzed, and in step S35, it is possible to write the selected defect together with its coordinates in the analysis subject data storage unit 25b. When the operation unit 9 selects defects, in the case where the number of selected defects per chip exceeds Icmax, it is preferable to add a process to prevent the selection of defects o f more than Icmax. Thereby, even in a case where defects are concentratively generated in some chip, it is made possible to select defects to be the subject of analysis from all over the chip.

In step S29, since categories are given to defects, the operation unit 9 is made possible, in step S34, to select defects in the order of the degree of the second fatality starting from the highest one by categories, and it is also made possible to write them together with their coordinates onto the analysis subject data storage unit 25b.

It is also good to give the categories, which are given in step S29, to the defects selected in step 34 and write them in the analysis subject data storage unit 25b. Thus, it is made possible to select the defects which are to be analyzed by the analysis apparatus 40 in the order of the second fatality starting from the one having the highest fatality.

Thereby, among the defects generated on a wafer W manufactured in a certain manufacturing process, about those which have the high second fatality and have to be analyzed with the analysis apparatus 40 and yet the identical result of analysis is expected, the defects to be the subject of analysis are narrowed down in number for selection, and then they are stored in the analysis subject data storage unit 25b together with their coordinates.

Figure 11:
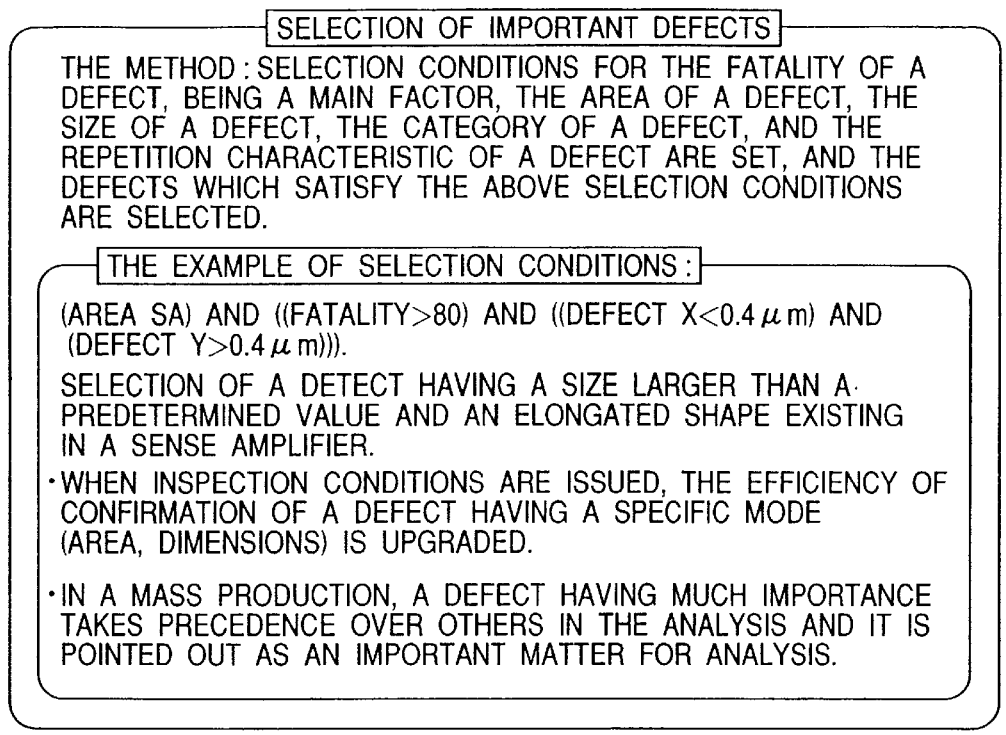
FIG. 11 shows an illustrative view showing an example of selection conditions of important defects according to the present conditions.

On the other hand in step S36, the operation unit 9, as shown in FIG. 11 as the selection of important defects, is also able to select the defects as the subjects of analysis mainly based on the fatality calculated in step S31 (the second fatality level FAH) and also based on the combination with other selection conditions and able to write them on the analysis subject data storage unit 25b. As the other selection conditions mentioned in the above following can be cited: the area in a chip in which a defect obtained in step S24 exists, the size of a defect obtained in step S22 (the lengths of a defect in the direction of X and Y axes, the area of a defect), a chip on a wafer in which a defect exists obtained in step S24 (repeatability among chips), the category of a defect, and so on. In FIG. 11, as the selection conditions, following are selected: as an area sense amplifier unit (SA) is selected and a defect having the fatality degree of more than 80 (a defect having a size larger than a certain predetermined value) and having a length of 0.4 $\mu$m or less in X direction and a length of 0.4 $\mu$m or more in Y direction, that is, a defect having an elongated shape is selected. In short, in the sense amplifier unit, the defects having the size larger than a predetermined value and defects having an elongated shape have high degree of fatality, so that they have to be selected for inspection. The inspection-data-processing apparatus 1 provides the analysis subject data stored in the analysis subject data storage unit 25b, for example, to the visual inspection apparatus 30; thereby, when the inspection conditions are issued, the efficiency of confirming a defect of a specific mode (area, size) can be upgraded. The inspection data processing apparatus 1 becomes possible to point out a defect having much importance in a mass production as an analysis point in precedence to others for the analysis apparatus 40.

Further, the analysis apparatus 40 inputs the information concerning the wafer which is to be analyzed using an input means and the analysis apparatus 40 obtains from the analysis subject data storage unit 25b the information about the defects which are narrowed down in number and have to be analyzed being the subjects of analysis. The analysis apparatus 40 analyses the quality and the properties of materials, and the cross-sectional configurations of these defects, which makes it possible to presumes the causes of generating fatal defects. The results of the analysis may be fed back to the manufacturing line management apparatus, to the visual inspection apparatus 30 or to the inspection data processing apparatus 1. Therefore, the managers of the manufacturing line will able to plan and execute the measures to remove the causes of generation of presumed defects based on the results of analysis, which may remarkably improve the yield rate of semiconductor elements.

The information about the defects generated on a wafer detected with the visual inspection apparatus 30 as shown below is stored in the inspection data storage unit 21: the inspection data ID, the area in a chip in which defects exist, the category of defects, and the second fatality level (including existence or non-existence). In the analysis subject data storage unit 25a, the information of defects being the subject of analysis to be analyzed in the analysis apparatus 40 is stored. Therefore the retrieval unit 5 can retrieve these useful information about the defects having the second fatality and extract such information and defects. The main control unit 10 can output the extracted useful information, for example, to the display unit 11 through the data input/output unit 4, or to offer the information to an external manufacturing line management apparatus through the network Nt. As mentioned in the above, the judgment of the second fatality in step S31 is based on the utilization of the category of a defect, so that the precision of the judgment is upgraded and useful information can be provided.

Figure 12:
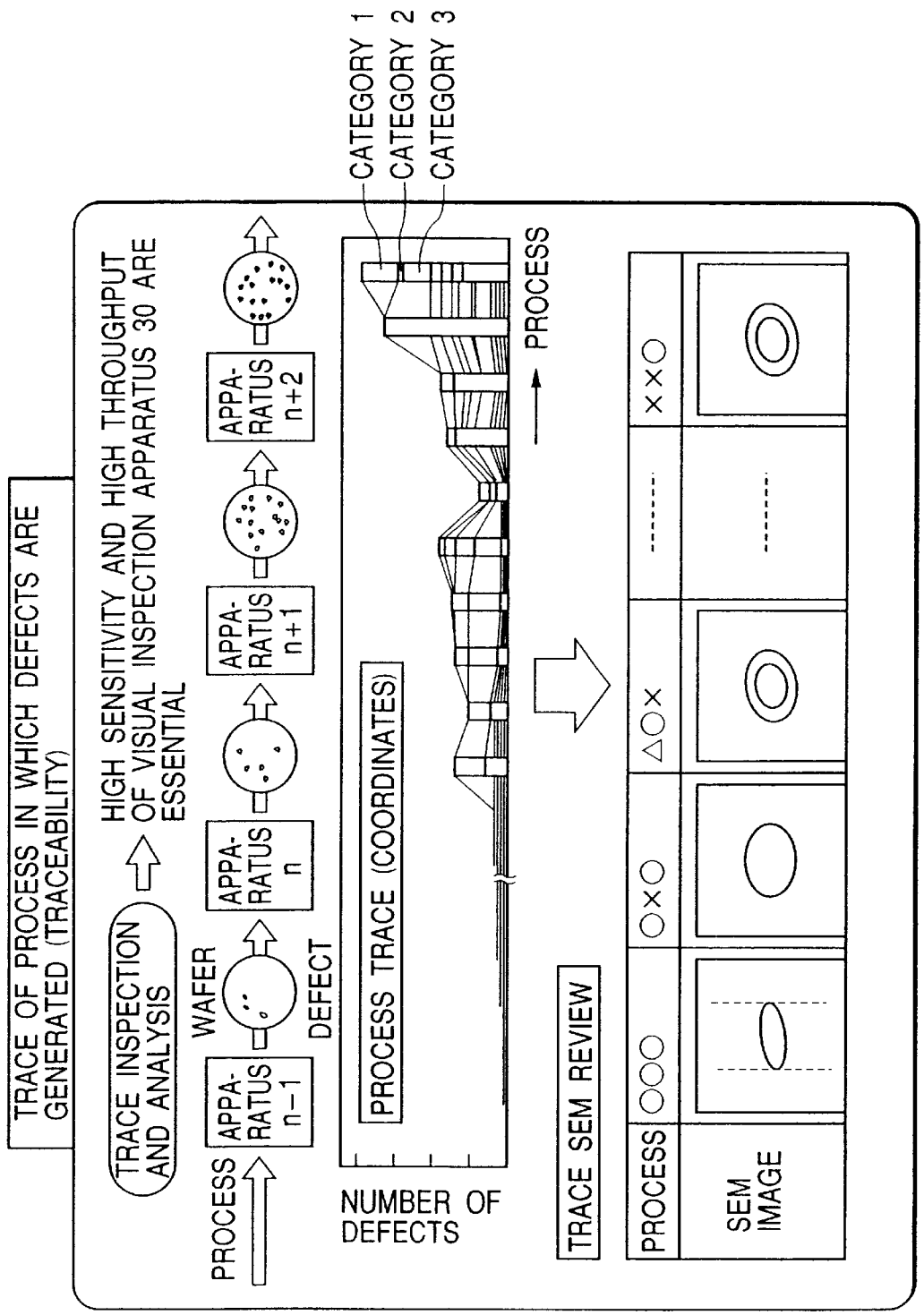
FIG. 12 shows an illustrative view explaining the fixing of a defect-generation-manufacturing process detected with the progress of the manufacturing process.

FIG. 12 shows the fixing of the generation of a defect detected with the visual inspection apparatus 30 for a semiconductor manufacturing line. In other words, a defect generated in a manufacturing process is extracted and fixed in step S22. Thus, for the trace inspection/analysis which traces the manufacturing process in which a defect or defects are generated, the upgrade of sensitivity and the improvement of throughput are required. In the case where a defect generated, at first, is caused by the sticking of a foreign material, since a film is formed over it, its influence exerts over the film, for example, it may cause breaking of a wire due to the exfoliation or thinness of a film. Therefore, in the visual inspection apparatus 30, a defect is detected as a foreign material defect in the first process, and in the next process the defect may detected as a circuit pattern defect such as breaking of a wire, changing the category of the defect. Therefore, such a phenomenon as shown in FIG. 12 occurs: in the process previous to the last, only defects in the category 3 were detected but in the last process, defects in the categories, 1 and 2, are detected. As a matter of fact, real cause which generated the defects is the sticking of a foreign material; therefore, the foreign material defect detected with the visual inspection apparatus 30 at first has to be classified to the defects having high fatality in the inspection-data-processing apparatus 1. In step S31, since the defects are weighted by categories, about the foreign material defects detected in the first process, the second fatality level can be detected high, and the defects having a high fatality level stored in the analysis subject data storage unit 25b or in the inspection data storage unit 21 are output; thereby, it is made possible to grasp the fact that a foreign material defect is generated in the first process and to take a measure quickly to meet the situation.

Figure 10A:
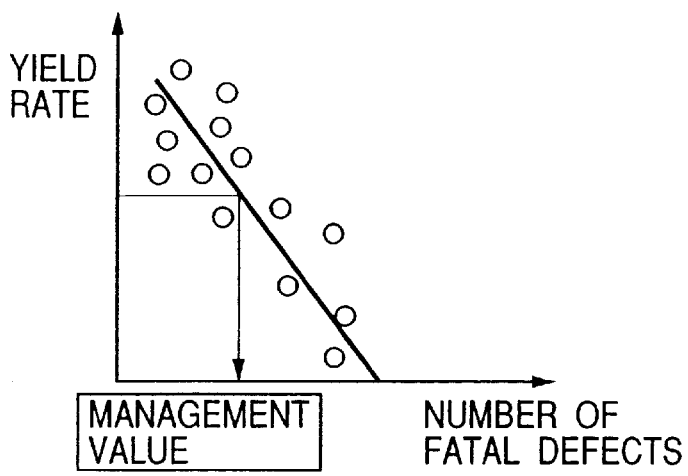
FIGS. 10($a$) and 10($b$) show illustrative views showing the relation between the number of fatal defects and the yield rate, and the management with the number of fatal defects according to the present invention.
Figure 10B:
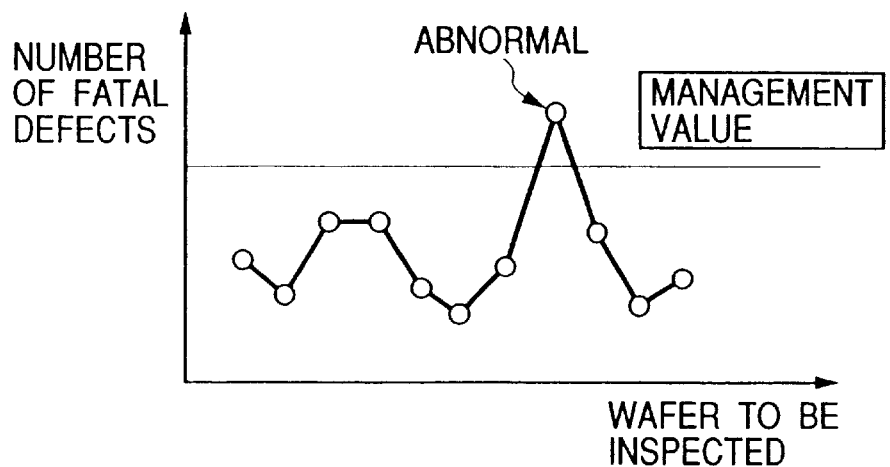

The inspection data processing apparatus 1 offers the number of the fatal defects generated on a wafer, in particular the number of the second fatality defects by wafer unit or by lot unit, for example, to the manufacturing line management apparatus; thereby, the inspection data processing apparatus 1 is able to issue a warning of an abnormal state, which makes the management of a manufacturing line possible. The number of fatal defects generated on a wafer shown in FIG. 10(b) and the yield rate are related mutually as shown in FIG. 10(a), so that it is possible to take a measure to decrease the number of fatal defects on the manufacture line, and in the result the yield rate in manufacturing semiconductor chips can be upgraded.

Figure 13:
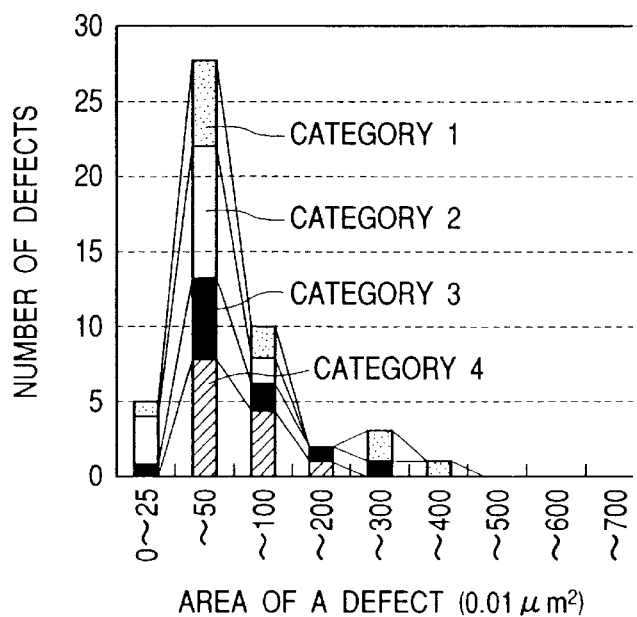
FIG. 13 shows a graph showing the number of defects by categories for defect areas calculated for every areas in a chip.

The inspection data processing apparatus 1, in step S29, is able to give categories to almost all defects, so that it is possible to calculate the number of defects by areas in a chip to be judged in step S24, and by categories of the areas of defects, a factor in the size of a defect. Thereby, a graph in which the abscissas represent the areas of defects and the ordinates represent the number of defects by categories can be output and displayed in the display unit 11 or in the display in an external management apparatus by areas in a chip as shown in FIG. 13. As a result, it is made possible to trace the origin of a defect which lowers the yield rate finally comparing with the result of the operation test in a prove test, which makes it possible to take an immediate measure for the above defect.

Further in the display unit 11, it is also possible to display distribution map information about defects having the second fatality, and images data (including category information) of defects detected with the review apparatus 31 by selection.

In step S29, in the case where categories are automatically given to images of defects detected with the review apparatus 31 and classified, in step S28, only images of defects having higher fatality levels are selected, which will be able to prevent vain review work. It brings about the reduction of working time and lowering of a work load in a review work.

The optimization of inspection conditions can be obtained by offering the above-mentioned useful information from the inspection data processing apparatus 1 to the visual inspection apparatus 30 for the purpose of detecting all defects having high fatality levels without omission in the visual inspection apparatus 30.

The judgment on the second fatality is performed based on the inspection data concerning the defects detected from wafers, subjects of inspection similar to each other, sent from a plurality of visual inspection apparatuses 30. The distribution map on the wafer of the judgment result of the second fatality is output to the display unit 11 as a Venn diagram; thereby, the differences between the visual inspection apparatuses can be visually grasped. When visual inspection apparatuses of different types are used, for example, a visual inspection apparatus for a foreign material defect and that for a circuit pattern defect, the difference in performance between the two can be objectively evaluated by the yardstick of the second fatality. As the evaluated result, it is made possible to use the visual inspection apparatuses of different types.

After a wafer W is processed through a film forming apparatus, an exposure apparatus and an etching apparatus, and when it is finally almost completed, an electric inspection called prove inspection is performed and electric characteristics of respective chips are made clear. Therefore, the prove inspection data are input to the inspection data processing apparatus 1 from the prove inspection apparatus through the network Nt. The prove inspection data are compared with the data of the second fatality level stored in the inspection data storage unit 21, and the difference in fatality between the two is grasped. Based on the difference, the process of derivation of the second fatality data (judgment rule by areas, weighting function by categories, etc.) can be corrected; thereby, more accurate fatality judgment is made possible.

The inspection data processing apparatus 1 is able to retrieve the contents of the important defects' data concerning the fatality of them stored in the inspection data storage unit 21 and the analysis results of defects analyzed in the analysis apparatus 40 and to edit the data described in the above. The results of the above retrieval or edition can be confirmed by outputting them to the display unit 11 for visual confirmation; thereby, the measures for the process or manufacturing apparatus which is supposed to be the cause of generating defects can be quickly taken.

The inspection data processing apparatus 1 which performs: the defect fatality judgment, the selection of the subject defects for review and analysis, the edition and retrieval of inspection data, can be directly incorporated into the visual inspection apparatus 30 without utilizing the network Nt. In this case, the details of defects' information can be grasped in the state where a wafer is being mounted on the visual inspection apparatus 30.

The inspection data processing apparatus 1 is also able to edit the process order of review and analysis or to edit the subjects of review and analysis utilizing the input inspection data comprising: chip discriminating coordinates, the coordinates of defects in a chip, the sizes of defects, the categories of defects etc. Therefore, it is possible to construct a review and analysis system in which the order of review and inspection or the subjects of review and analysis can be controlled. A review station 31 in the review and analysis system can be a SEM. When a viewer which has the function of edition, for example, a viewer which is able to observe images detected with the review station 31 and able to perform numbering of them is provided, a user will be able to edit the results of review or able to utilize them for preparing his report. Further, when a cross-sectional photograph of a defect is taken with a SEM, data can be more effectively narrowed down by using the inspection data processing method as mentioned in the above.

The analysis apparatus 40 is able to perform analysis by the observation of a section, for example the stage of an FIB (Focused Ion Beam) analysis apparatus is moved to the position of a defect to scrape off a part of it by irradiating it with FIB to form a section and the section is observed by taking a photograph with a SEM. The present invention can be naturally applied to an effective use of an analysis apparatus such as an element analysis apparatus.

In the above-mentioned embodiment, a semiconductor wafer is cited as a subject of inspection; however, the present invention can be also applied to the inspection of liquid crystal substrates, etc. having circuit patterns. It is naturally possible to form various kinds of variations without departing from the spirit of the present invention.

As explained in the above, according to the present invention, the fatality of defects is judged according to the kinds of areas where defects exist and to the categories of defects based on the inspection data of defects detected with a visual inspection apparatus, so that the defects having fatality can be accurately selected. In the result, it is made possible to narrow down the defects to the ones which are really in need of review or analysis, which makes the review work or analysis work possible to be effectively realized, and at the same time, makes the management of a manufacturing line possible to be performed in relation with the yield rate of the manufacturing line.

What is claimed is:

1. An inspection data processing method for processing inspection data composed of coordinates data and characteristic quantity data concerning a defect detected with a visual inspection apparatus, said defect being generated on a subject of inspection, comprising:

a preparation step of storing a fatality judgment data group corresponding to respective kinds of a plurality of areas formed on said subject of inspection beforehand;

an area judgment step of finding the kind of an area in which a defect exists based on coordinates data concerning the defect in said inspection data; and a fatality judgment step of selecting the fatality judgment data corresponding to the kind of the area obtained in said area judgment step out of the fatality judgment data group stored in said preparation step, and judging the fatality of a defect based on the selected fatality judgment data based on the characteristic quantity data of the defect in said inspection data.

2. An inspection data processing method for processing inspection data composed of coordinates data and characteristic quantity data concerning a defect detected with a visual inspection apparatus, said defect being generated on a subject of inspection, comprising:

a preparation step of storing beforehand a first fatality judgment data group corresponding to respective kinds of a plurality of areas formed on said subject of inspection and a second fatality judgment data group corresponding to categories of defects;

an area judgment step of finding the kind of an area in which a defect exists based on coordinates data concerning the defect in said inspection data;

a first fatality judgment step of selecting first fatality judgment data corresponding to the kind of the area obtained in said area judgment step out of the first fatality judgment data group stored in said preparation step, and judging a first fatality level of the defect based on said selected fatality judgment data based on the characteristic quantity data of the defect in said inspection data;

a category giving step of giving a category to the defect in said inspection data; and a second fatality judgment step of selecting a second fatality judgment data corresponding to the category given in said category giving step out of the second fatality judgment data group stored in said preparation step, and judging a second fatality of the defect based on the selected second fatality judgment data based on the first fatality level of the defect judged in said first fatality judgment.

3. An inspection data processing method as defined in claim 2, further comprising a trace step of obtaining the inspection data about a defect, provided by tracing a manufacturing process in which the defect has been generated by comparing inspection data of a subject of inspection manufactured in a previous manufacturing process and inspection data of a subject of inspection manufactured in a manufacturing process after that.

4. An inspection data processing method as defined in claim 2, further comprising an output step of outputting information concerning the second fatality of a defect to be judged in said second fatality judgment step.

5. An inspection data processing method as defined in claim 2, further comprising an output step of outputting information concerning the first fatality of a defect to be judged in said first fatality judgment step.

6. An inspection data processing method as defined in claim 2, further comprising a selection step of selecting a subject of analysis according to the second fatality level of a defect to be judged in said second fatality judgment step.

7. An inspection data processing method as defined in claim 6, further comprising an analysis step of analyzing a defect utilizing an analysis apparatus concerning the defect selected in said selection step.

8. An inspection data processing method as defined in claim 2, wherein the second fatality judgment data group stored in said preparation step are a group of weighting functions.

9. An inspection data processing method as defined in claim 2, wherein said category giving step is performed using a review apparatus.

10. An inspection data processing method as defined in claim 2, wherein said category giving step includes a step of giving a category to the defect selected according to the first fatality level of the defect judged in said first fatality judgment step.

11. An inspection data processing method as defined in claim 6, further comprising an output step of outputting information concerning a defect being a subject of analysis selected in said selection step.

12. An inspection data processing method as defined in claim 2, further including a step of correcting the first or the second fatality judgment data group based on results of a final prove test in said preparation step.

13. An inspection data processing method for processing inspection data composed of coordinates data and characteristic quantity data concerning a defect detected with a visual inspection apparatus, said defect being generated on a subject of inspection, comprising:

a preparation step of storing a fatality judgment data group corresponding to a category of a defect beforehand;

a category giving step of giving the category to a defect in said inspection data; and a fatality judgment step of selecting fatality judgment data corresponding to the category given in said category giving step out of the fatality judgment data group stored in said preparation step, and judging the fatality of the defect based on said selected fatality judgment data.

14. An inspection data processing method for processing inspection data composed of coordinates data and characteristic quantity data concerning a defect detected with a visual inspection apparatus, said defect being generated on a subject of inspection, comprising:

a trace step of obtaining the inspection data about a defect, provided by tracing a manufacturing process in which the defect has been generated by comparing inspection data for a subject of inspection manufactured in a previous manufacturing process and inspection data for a subject of inspection manufactured in a manufacturing process after that;

an area judgment step of finding the kind of an area in which the defect exists based on coordinates data concerning the defect in the inspection data obtained in said trace step;

a category giving step of giving a category to the defect obtained in said trace step;

a calculation step of calculating the number of defects for the category given in said category giving step corresponding to a characteristic quantity of the defect in the inspection data obtained in said trace step for every area judged in said area judgment step; and an output step of outputting the number of defects for the category corresponding to the characteristic quantity of the defect for every area calculated in said calculation step.

15. An inspection data processing apparatus for processing inspection data composed of coordinates data and characteristic quantity data concerning a defect detected with a visual inspection apparatus, said defect being generated on a subject of inspection, comprising:

a storage unit for storing a first fatality judgment data group corresponding to respective kinds of a plurality of areas formed on the subject of inspection beforehand;

an area judgment unit for finding the kind of an area in which a defect exists based on coordinates data concerning the defect in said inspection data; and a fatality judgment unit for selecting fatality judgment data corresponding to the kind of the area obtained in said area judgment unit out of the first fatality judgment data group stored in said storage unit, and judging the fatality of the defect based on said selected fatality judgment data based on the characteristic quantity data of the defect in said inspection data.

16. An inspection data processing apparatus for processing inspection data composed of coordinates data and characteristic quantity data concerning a defect detected with a visual inspection apparatus, said defect being generated on a subject of inspection, comprising:

a storage unit for storing beforehand a first fatality judgment data group corresponding to the kinds of a plurality of areas formed on said subject of inspection and a second fatality judgment data group corresponding to a category of a defect;

an area judgment unit for finding the kind of an area in which a defect exists based on coordinates data about the defect in said inspection data;

a first fatality judgment unit for selecting first fatality judgment data corresponding to the kind of the area obtained in said area judgment unit out of the first fatality judgment data group stored in said storage unit, and judging a first fatality level of the defect based on said selected fatality judgment data based on the characteristic quantity data of the defect in said inspection data;

a category giving apparatus for giving a category to the defect in said inspection data; and a second fatality judgment unit for selecting second fatality judgment data corresponding to the category given by said category giving apparatus out of the second fatality judgment data group stored in said storage unit, and judging a second fatality of the defect based on the selected second fatality judgment data based on the first fatality level of the defect judged in said first fatality judgment unit.

17. An inspection data processing apparatus as defined in claim 16, further comprising a trace unit for obtaining the inspection data about a defect, provided by tracing a manufacturing process in which the defect has been generated by comparing inspection data for a subject of inspection manufactured in a previous manufacturing process and inspection data for a subject of inspection manufactured in a manufacturing process after that.

18. An inspection data processing apparatus as defined in claim 16, further comprising an output unit for outputting information concerning the second fatality of a defect to be judged in said second fatality judgment unit.

19. An inspection data processing apparatus as defined in claim 16, further comprising an output unit for outputting information concerning the first fatality of a defect to be judged in said first fatality judgment unit.

20. An inspection data processing apparatus as defined in claim 16, wherein said second fatality judgment unit comprises a selection unit for selecting a subject of analysis according to the second fatality level of a defect to be judged.

21. An inspection data processing apparatus as defined in claim 20, further comprising an analysis apparatus for analyzing the defect selected in said selection unit.

22. An inspection data processing apparatus as defined in claim 16, wherein the second fatality judgment data group stored in said storage unit are a group of weighting functions.

23. An inspection data processing apparatus as defined in claim 16, wherein said category giving unit is constituted with a review apparatus.

24. An inspection data processing apparatus as defined in claim 16, wherein said category giving unit gives a category to a defect selected according to the first fatality level of the defect judged in said first fatality judgment unit.

25. An inspection data processing apparatus as defined in claim 20, further comprising an output unit for outputting information about a defect being a subject of analysis selected in said selection unit.

26. An inspection data processing apparatus for processing inspection data composed of coordinates data and characteristic quantity data concerning a defect detected with a visual inspection apparatus, said defect being generated on a subject of inspection, comprising:

a storage unit for storing a fatality judgment data group corresponding to a category of a defect beforehand;

a category giving unit for giving the category to a defect in said inspection data; and a fatality judgment unit for selecting fatality judgment data corresponding to the category given in said category giving step out of the fatality judgment data group stored in said storage unit and, judging the fatality of the defect based on the selected fatality judgment data.

27. An inspection data processing apparatus for processing inspection data composed of coordinates data and characteristic quantity data concerning a defect detected with a visual inspection apparatus, said defect being generated on a subject of inspection, comprising:

a trace unit for obtaining the inspection data about a defect, provided by tracing a manufacturing process in which the defect has been generated by comparing inspection data for a subject of inspection manufactured in a previous manufacturing process and inspection data for a subject of inspection manufactured in a manufacturing process after that;

an area judgment unit for finding the kind of an area in which the defect exists based on coordinates data about the defect in the inspection data obtained by said trace unit;

a category giving unit for giving a category to the defect obtained in said trace unit;

a calculation unit for calculating the number of defects for the category given in said category giving unit corresponding to the characteristic quantity of the defect in the inspection data obtained by said trace unit for every area judged in said area judgment unit; and an output unit for outputting the number of defects for the category corresponding to the characteristic quantity of the defect for every area calculated in said calculation unit.

* * * * *